United States Patent
Saito et al.

(10) Patent No.: US 12,240,011 B2
(45) Date of Patent: Mar. 4, 2025

(54) SLIDING DEVICE FOR SUPPLYING OR REMOVING A SLIDING PROCESS MATERIAL TO OR FROM A SURFACE OF AN OBJECT TO BE CONVEYED

(71) Applicant: DEXERIALS CORPORATION, Shimotsuke (JP)

(72) Inventors: Takayuki Saito, Shimotsuke (JP); Masahiro Nishimoto, Shimotsuke (JP); Ikuo Mitsushima, Kanuma (JP); Masaki Kaneko, Shimotsuke (JP)

(73) Assignee: DEXERIALS CORPORATION, Shimotsuke (JP)

( * ) Notice: Subject to any disclaimer, the term of this patent is extended or adjusted under 35 U.S.C. 154(b) by 0 days.

(21) Appl. No.: 17/606,897

(22) PCT Filed: Apr. 30, 2020

(86) PCT No.: PCT/JP2020/018359
§ 371 (c)(1),
(2) Date: Oct. 27, 2021

(87) PCT Pub. No.: WO2020/222310
PCT Pub. Date: Nov. 5, 2020

(65) Prior Publication Data
US 2022/0250110 A1     Aug. 11, 2022

(30) Foreign Application Priority Data

Apr. 30, 2019   (JP) .................................. 2019-087139
Apr. 30, 2020   (JP) .................................. 2020-080837

(51) Int. Cl.
*B05C 11/02*     (2006.01)
*B05C 13/02*     (2006.01)
(Continued)

(52) U.S. Cl.
CPC .......... *B05C 11/028* (2013.01); *B05C 11/023* (2013.01); *B05C 13/02* (2013.01);
(Continued)

(58) Field of Classification Search
CPC ......... B05C 11/028; B05C 13/02; B05C 5/02; B05C 11/02; B05C 19/04; H01L 21/3212; B24B 37/11; B65G 13/00
(Continued)

(56) References Cited

U.S. PATENT DOCUMENTS 3,690,297 A * 9/1972 Dentch ................... D21H 23/36
                                                        118/410
5,870,793 A * 2/1999 Choffat ..................... B08B 1/04
                                                        15/97.1
(Continued)

FOREIGN PATENT DOCUMENTS

CN     1977369 A      6/2007
JP     H10-16183 A    1/1998
(Continued)

OTHER PUBLICATIONS

English translation, Description, JP2002066467, Kazuyoshi, published Mar. 5, 2002 (Year: 2002).*
(Continued)

*Primary Examiner* — Karl Kurple
(74) *Attorney, Agent, or Firm* — Oliff PLC

(57) ABSTRACT

A sliding device configured to perform a sliding process on a surface of an object to be slid includes a sliding part including sliding bodies each having a flat working surface; a first driving mechanism configured to regularly move the sliding bodies in parallel with the working surfaces of the sliding bodies; and a second driving mechanism configured to regularly move the sliding part in parallel with the working surfaces in a direction different from a moving
(Continued)

direction by the first driving mechanism while the first driving mechanism moves the sliding bodies. This enables uniform supply of the sliding process material onto the surface of the object to be slid or clean the surface of the object to be slid.

12 Claims, 7 Drawing Sheets

(51) Int. Cl.
    *B23K 3/06*         (2006.01)
    *B65G 13/00*       (2006.01)

(52) U.S. Cl.
    CPC ............ *B23K 3/0623* (2013.01); *B65G 13/00* (2013.01); *H05K 2203/041* (2013.01)

(58) Field of Classification Search
    USPC ......................................... 118/100, 242, 264
    See application file for complete search history.

(56) References Cited

U.S. PATENT DOCUMENTS

| | | | | |
|---|---|---|---|---|
| 6,286,525 | B1 * | 9/2001 | Nishimura | B08B 1/32 134/902 |
| 7,632,434 | B2 * | 12/2009 | Duescher | C09K 3/1436 264/13 |
| 10,569,293 | B2 * | 2/2020 | Pozzi | B05C 11/04 |
| 10,722,965 | B2 * | 7/2020 | Tsuruta | B23K 1/00 |
| 2002/0092544 | A1 * | 7/2002 | Namba | H01L 21/67046 134/6 |
| 2004/0235406 | A1 * | 11/2004 | Duescher | B24D 11/001 51/300 |
| 2010/0213609 | A1 * | 8/2010 | Kondou | H01L 24/13 257/737 |
| 2016/0271715 | A1 * | 9/2016 | Tsuruta | B23K 3/0623 |
| 2022/0234073 | A1 * | 7/2022 | Saito | B05D 1/42 |

FOREIGN PATENT DOCUMENTS

| | | |
|---|---|---|
| JP | 2000-085100 A | 3/2000 |
| JP | 2000-296368 A | 10/2000 |
| JP | 2002-506205 A | 2/2002 |
| JP | 2002-066467 A | 3/2002 |
| JP | 2002-134388 A | 5/2002 |
| JP | 2005-052741 A | 3/2005 |
| JP | 2016-111345 A | 6/2016 |
| KR | 10-0560606 B1 | 3/2006 |
| KR | 10-2008-0022170 A | 3/2008 |
| KR | 20090082112 A * | 7/2009 ............. H05K 13/04 |

OTHER PUBLICATIONS

JP2000085100, Sasaki, published Mar. 28, 2000 (Year: 2000).*
English translation, Description, JP2000085100, published Mar. 28, 2000 (Year: 2000).*
"5 Plastics with low coefficient of friction", PolyAlto 2023. pp. 1-2. (Year: 2023).*
Website of Japan Engineering Plastics Technical Committee; 2015;(http://enpla.jp/enpla/bunrui.html).
Jul. 7, 2020 Search Report issued in International Patent Application No. PCT/JP2020/018359.
Jul. 7, 2020 Written Opinion of the International Searching Authority issued in International Patent Application No. PCT/JP2020/018359.
May 18, 2021 International Preliminary Report on Patentability issued in International Patent Application No. PCT/JP2020/018359.
Jun. 24, 2022 Office Action issued in Chinese Patent Application No. 202080032353.3.
Jan. 12, 2023 Office Action issued in Chinese Patent Application No. 202080032353.3.
Oct. 17, 2023 Office Action issued in Japanese Patent Application No. 2020-080837.
Nov. 20, 2023 Office Action issued in Taiwanese Patent Application No. 109114695.
Nov. 29, 2023 Office Action issued in Chinese Patent Application No. 202080032353.3.
Mar. 19, 2024 Office Action issued in Japanese Application No. 2020-080837.
Sep. 13, 2023 Office Action issued in Korean Patent Application No. 10-2021-7035431.
Sep. 1, 2023 Office Action issued in Chinese Patent Application No. 202080032353.3.

\* cited by examiner

A-A CROSS-SECTIONAL VIEW

SLIDING DEVICE FOR SUPPLYING OR REMOVING A SLIDING PROCESS MATERIAL TO OR FROM A SURFACE OF AN OBJECT TO BE CONVEYED

TECHNICAL FIELD

The present invention relates to a sliding device that supplies a sliding process material to or removes it from a surface of an object to be slid.

BACKGROUND ART

Filler-containing films obtained by filling concaves in the film surface with a predetermined filler have recently been in demand in various applications. For example, biosensor electrodes are fabricated by supplying an electrode paste to a predetermined pattern of concaves formed in a film substrate and removing an excessive paste with a wiping device (Patent Literature 1). In such a case, the supply of the paste to the concaves and the wiping of the excessive paste use different blades.

Printing apparatuses typically use a squeegee to spread an ink over a mask plate. To make the printing density uniform, it has been proposed to reciprocate the squeegee in a direction (x direction) orthogonal to a long-side direction of the squeegee and reciprocate the squeegee in the long-side direction (y direction) of the squeegee as well, thereby moving the squeegee in zigzags with respect to the mask plate (Patent Literature 2).

Blades or squeegees have thus been used heretofore in supplying a filler to concaves or holes in a base surface and removing an excessive filler from the base surface.

CITATION LIST

Patent Literature

Patent Literature 1: Japanese Translation of PCT Patent Application Publication No. 2002-506205
Patent Literature 2: Japanese Patent Application Laid-Open No. H10-16183

SUMMARY OF INVENTION

Technical Problem

In supplying a filler to an embossed body having a predetermined concave pattern in its surface, a squeegee can be moved in zigzags according to the description of Patent Literature 2 so that the filler is evenly supplied. However, if the squeegee is moved in zigzags, it is difficult to sufficiently increase the ratio ($100 \times N1/N0\%$) of the number (N1) of concaves filled with the filler relative to the number (N0) of concaves in the surface of the embossed body especially near both widthwise edges of the surface of the embossed body where the squeegee moves while alternating directions. In other words, there occur portions where the filler is unevenly supplied. If the input amount of the filler is increased to address this, filler waste increases. There are also concerns such as damage to and deformation of filler particles due to excessive rubbing of the filler particles with each other.

In view of such problems of the conventional techniques, an object of the present invention is to: in supplying a sliding process material such as a filler to concaves in the surface of an object to be slid with an embossed body or the like having a predetermined concave pattern formed in its surface being regarded as the object to be slid, enable uniform supply of the sliding process material to all concaves in a region where the processing for supply of the sliding process material to the object to be slid is performed (hereinafter, referred to as a region to be slid) and removal of an excess of the sliding process material from the object to be slid; reduce the amount of the excess of the sliding process material eventually removed from the object to be slid in the sliding process material supplied to the object to be slid to prevent damage to and deformation of the sliding process material due to excessive collision or rubbing of the sliding process material with each other; and if the surface of the object to be slid is flat and the sliding process material is supplied to the surface, enable uniform supply of the sliding process material to the entire surface of the region to be slid.

In the present invention, if the object to be slid is an embossed body and the sliding process material is a granular material, supplying the sliding process material to the surface of the object to be slid includes uniformly filling concaves in the surface of the embossed body with the granular material. If the sliding process material is a liquid material, the supplying process also includes forming a coating of uniform thickness of the liquid material on the surface of the object to be slid. In the present invention, if there is a granular material adhering to the object to be slid, removing the sliding process material from the surface of the object to be slid includes removing the granular material by supplying a liquid material as the sliding process material.

Solution to Problem

The present inventors have conceived that if, unlike a squeegee that makes an edge contact with the object to be slid, a sliding part including a plurality of sliding bodies each having a flat working surface for the object to be slid is used and the sliding bodies are moved in a first direction while the sliding part is moved in a second direction, the amount of relative movement of the sliding process material with respect to the object to be slid during the sliding process increases, the sliding process material is uniformly supplied to the object to be slid, and an excess of the sliding process material is removed from the object to be slid, and if no sliding process material is supplied, the surface of the object to be slid can be cleaned, thereby achieving the present invention.

More specifically, the present invention provides a sliding device including:
  a sliding part including a plurality of sliding bodies each having a flat working surface; and
  a driving mechanism configured to regularly move the sliding part with respect to an object to be slid in parallel with the working surfaces of the sliding bodies and in a direction different from a moving direction of the sliding bodies while regularly moving the sliding bodies with respect to the object to be slid in parallel with the working surfaces.

In this sliding device, a sliding process is performed on a surface of the object to be slid by using the sliding bodies of the sliding part.

Advantageous Effects of Invention

According to the sliding device of the present invention, the sliding bodies are moved with respect to the object to be slid in a first direction while the sliding part including the sliding bodies is moved in a second direction. This increases the amount of movement per unit time of an arbitrary point in the working surface of each sliding body with respect to the object to be slid, compared to the case where the sliding bodies are moved in only either one of the directions. The amount of movement of the sliding process material moved by the sliding bodies over the object to be slid also increases. Moreover, unlike a squeegee, the sliding bodies do not make an edge contact with the object to be slid but instead have flat working surfaces to act on the object to be slid. If the sliding process material is supplied to this sliding device, the sliding process material is moved over the object to be slid not only by being pressed by the side surfaces of the sliding bodies, but also by being captured by the working surfaces, which are the bottom surfaces of the sliding bodies. Consequently, according to the sliding device of the present invention, the amount of the sliding process material moved over the object to be slid by the sliding bodies and the amount of movement both increase. This enables uniform supply of the sliding process material to the region to be slid and removal of an excess of the sliding process material from the region to be slid, and can reduce the amount of supply of the sliding process material needed to process the object to be slid with the sliding process material.

Consequently, if, for example, an embossed body is used as the object to be slid and a filler is used as the sliding process material, concaves in the surface of the embossed body can be uniformly filled with the filler, and any non-functional filler adhering to portions other than the concaves can be removed. This can reduce the input amount of the filler required to uniformly fill the concaves in the embossed body.

Moreover, if, for example, a liquid material is supplied as the sliding process material, excessive substances adhering to the object to be slid can be removed by wiping the object to be slid using the liquid material. The surface of the object to be slid can also be cleaned by performing the sliding process on the object to be slid without supplying the sliding process material.

DESCRIPTION OF EMBODIMENTS

Figure 1:
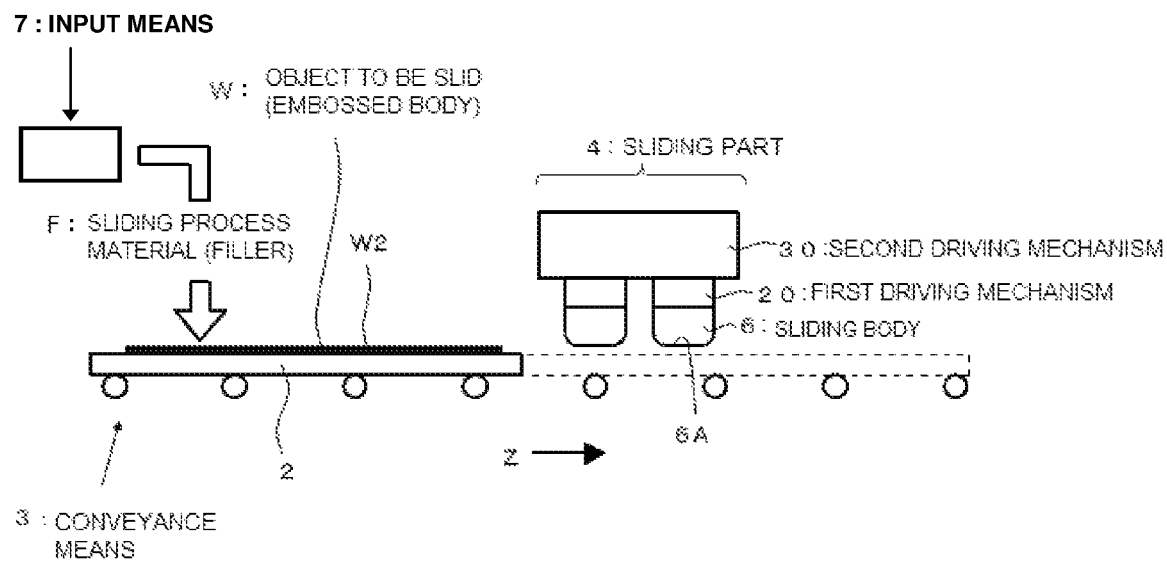
FIG. 1 is a schematic side view showing a sliding device according to an embodiment of the present invention.

A sliding device according to the present invention will be described in detail below with reference to the drawings. In the drawings, the same reference numerals denote the same or equivalent components.

<Overview of Sliding Device>

FIG. 1 is a schematic side view of a sliding device 1 according to an embodiment of the present invention. This sliding device 1 includes a sliding part 4. With respect to the sliding part 4, an object to be slid is an embossed body W having concaves in its surface, and a sliding process material is a filler F. Sliding parts 4 are preferably placed side by side in a conveyance direction (arrow Z) of the embossed body W as needed.

The sliding part 4 includes a plurality of sliding bodies 6 each having a flat working surface 6A. A positional relationship between the working surfaces 6A and the surface of the embossed body W is adjusted so that the working surfaces 6A make contact with the surface of the embossed body W.

The sliding device 1 includes driving mechanisms 20 and 30 for moving the sliding bodies 6 in a first direction while moving the sliding part 4 in a second direction different from the first direction. The first driving mechanism 20 regularly moves the sliding bodies 6 in parallel with the working surfaces 6A. While the first driving mechanism 20 is moving the sliding bodies 6, the second driving mechanism 30 regularly moves the entire sliding part 4 including the plurality of sliding bodies 6 in parallel with the working surfaces 6A. The first driving mechanism and the second driving mechanism may have common or different driving sources. The sliding device according to the present invention may include an integral driving mechanism as a driving mechanism for moving the sliding bodies and the sliding part in the foregoing manner.

The sliding device 1 includes a process material input means configured to input the filler F to a predetermined position on a surface W2 of the embossed body W. If needed, the sliding device 1 may include a squeegee that somewhat spreads the inputted filler F to the embossed body W over the embossed body W before the filler F is spread out by the sliding part 4.

As will be described below, the sliding bodies 6, which are moved by the first driving mechanism 20 and the second driving mechanism 30, uniformly supplies the filler F to the embossed body W, so that the concaves in the embossed body W are filled with the filler F and an excess of the filler F, filler present outside the concaves, is removed from the surface of the embossed body W. Alternatively, the supplied filler F fills the concaves W3 of the embossed body at a high ratio, and none or only a slight amount of filler F is removed. The present invention is therefore useful as a device for filling the concaves in the embossed body with the filler as well as a device for removing excess filler present at positions other than the concaves. Furthermore, the present invention can also be used in the case of collecting and reusing the removed filler.

<Object to be Slid>

In the present invention, the object W to be slid has a surface parallel to the working surfaces 6A of the sliding body 6 and can be various plates, films, solid articles, and the like. The sliding device 1 can include a support mechanism and a conveyance mechanism for the object W to be slid as appropriate, depending on the type, form, and other properties of the object to be slid. For example, if the object to be slid is a plate, film, or the like, the sliding device 1 may include a seat for supporting the object to be slid, a driving device serving as a conveyance mechanism, and a winding device.

Figure 2:
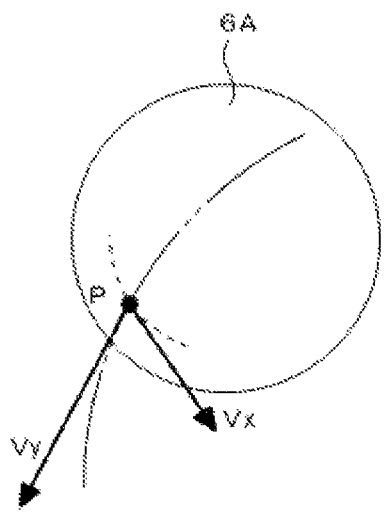
FIG. 2 is an explanatory diagram showing operation of a sliding body according to the embodiment of the present invention.
Figure 4A:
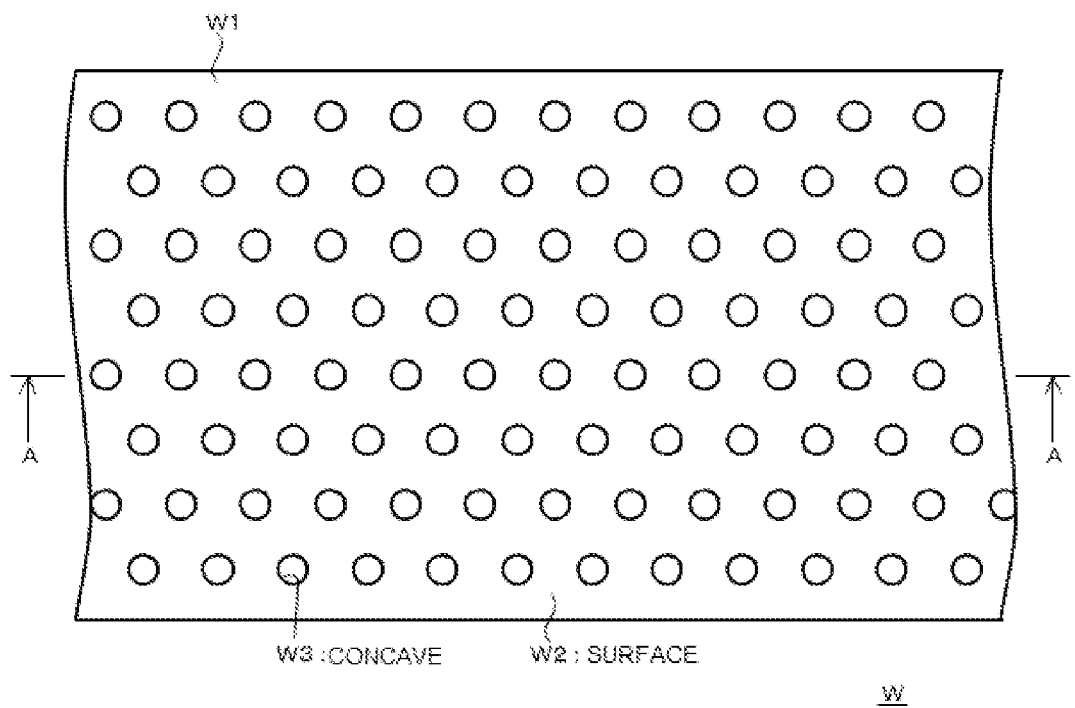
FIG. 4A is a plan view of an embossed body used as an object to be slid.
Figure 4B:
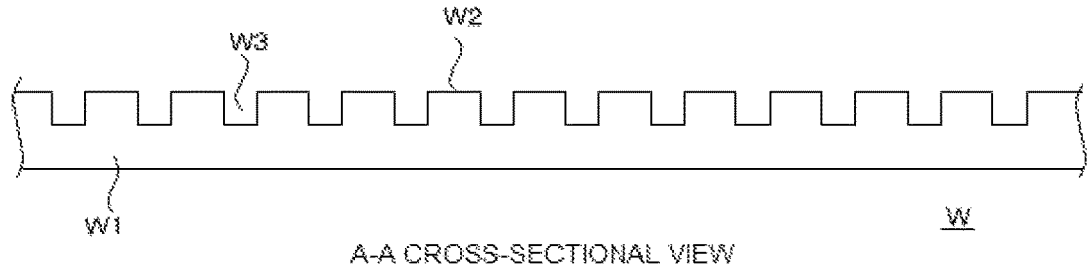
FIG. 4B is a cross-sectional view of the embossed body shown in FIG. 4A.

The sliding device 1 of the embodiment shown in FIGS. 1 and 2 uses a plate-shaped embossed body as the object W to be slid. As shown in FIGS. 4A and 4B, the embossed body W has a plurality of concaves W3 in the surface W2 of a long embossed main body W1. Alternatively, the embossed body W may have surface unevenness so that the filler F is retained at predetermined positions.

The embossed body W can be formed of a plastic or curable resin, metal, or the like, utilizing physical properties and functionality thereof. The thickness, width, and length of the embossed body W are not limited in particular. For example, the width (length in a direction orthogonal to the conveyance direction) of the embossed body W, whether plate-shaped or film-shaped, can be 10 cm or more, 30 cm or more, or 50 cm or more, and can be 10 m or less, 5 m or less, or 2 m or less, depending on the use of the embossed body after the sliding process. If the embossed body W is plate-shaped, the length (length in the conveyance direction) can be less than 1 m, 1 m or more, or 5 m or more, for example. If the embossed body W is film-shaped, the length may be 5 m or more, or 100 m or more. If the embossed body is formed into a roll (wound around a winding core) in view of handling, the upper limit of the length can typically be 5000 m or less, 1000 m or less, or 300 m or less.

The thickness of the embossed body W is not limited in particular as long as the sliding process can be performed without malfunction by conveying the embossed body W to the sliding part 4 by the conveyance means 3 and bringing the embossed body W into contact with the sliding bodies 6 or maintaining a predetermined distance therebetween.

The material of the embossed body W is not limited to a resin. The embossed body W may be a surface-treated piece of glass or metal, or have a layered structure of a plurality of types of materials selected from various resins, glasses, and metals. Each layer constituting the embossed body W or the entire embossed body may be rigid, flexible, or elastic, and may be adhesive at normal temperature (25° C.±15° C.). As a resin material for forming the embossed body, a thermoplastic resin or thermosetting resin corresponding to desired physical properties and the like can be selected as appropriate, for example, from among organic materials for chemical device materials listed in Handbook of Chemistry (1st ed., Applied Chemistry), and general-purpose plastics, engineering plastics, and special engineering plastics listed in Iwanami Rikagaku Jiten (4th ed.) and the Website of Japan Engineering Plastics Technical Committee (http://enpla.jp/enpla/bunrui.html). Similarly, various general-purpose metal materials can also be used. In general, in filling the embossed body with the filler by the sliding process, it is difficult to uniformly fill the entire region of the embossed body to be slid with the filler if the embossed body W is flexible or adhesive. According to the present invention, even a flexible or adhesive embossed body W, whether a single-layered article or a laminate, can be used as the object to be slid.

If the embossed body W has a layered structure of a plurality of types of layers, an adhesive layer or a similar resin layer may be interposed between a layer having surface unevenness such as the concaves W3 and an underlying layer. For example, the layer having surface unevenness may be a rigid layer, an elastic body, or a plastic body. If the temperature during the sliding process is normal temperature, the layer having surface unevenness may be a high-viscosity viscous body or viscoelastic body capable of maintaining the shape of the surface unevenness at normal temperature. An adhesive layer or a similar layer located under the layer having surface unevenness may have a viscosity as high as or higher than that of the layer having surface unevenness, or lower than that of the layer having surface unevenness, or be a liquid or a viscous body similar to such a liquid. The layer located under the layer having surface unevenness thus has a viscosity in the range of 0.1 Pa·s to $10^4$ Pa·s at normal temperature, for example. The numerical value is measured by a conventional oscillational viscometer, rotational viscometer, or viscoelasticity measuring instrument (for example, a rheometer manufactured by TA Instruments). In the present invention, the filler can be accommodated into the concaves without the application of excessive load such as causing deformation or damage to filler particles even if the embossed body W is such a laminate of layers of various materials or having various physical properties.

The machining method for forming the surface unevenness such as the concaves W3 on/in the surface of the embossed body W is not limited in particular as long as dimensions can be controlled in units of μm. Techniques such as cutting, punching, etching, lamination of porous layers, and printing can be used depending on the types of materials constituting the embossed body W. Pits and projections formed on a master in advance may be transferred to the layer that forms the surface of the embossed body W. If, for example, the embossed body W has a metal surface, the surface unevenness can be formed by cutting. If the surface unevenness of the embossed body W is formed of a resin, the surface unevenness may be formed by various printing techniques. Layers having surface unevenness or holes may be laminated.

Figure 5:
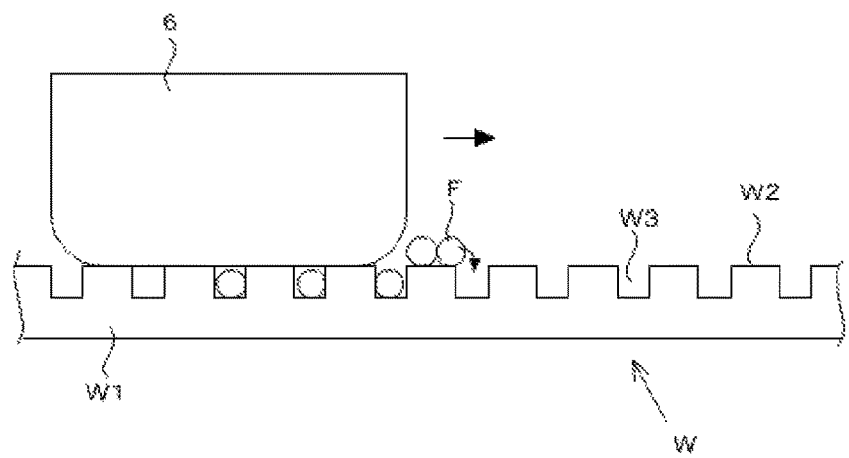
FIG. 5 is an explanatory diagram showing a filler supply operation by the sliding body in a case where the embossed body is used as the object to be slid and a filler is used as a sliding process material.
Figure 6:
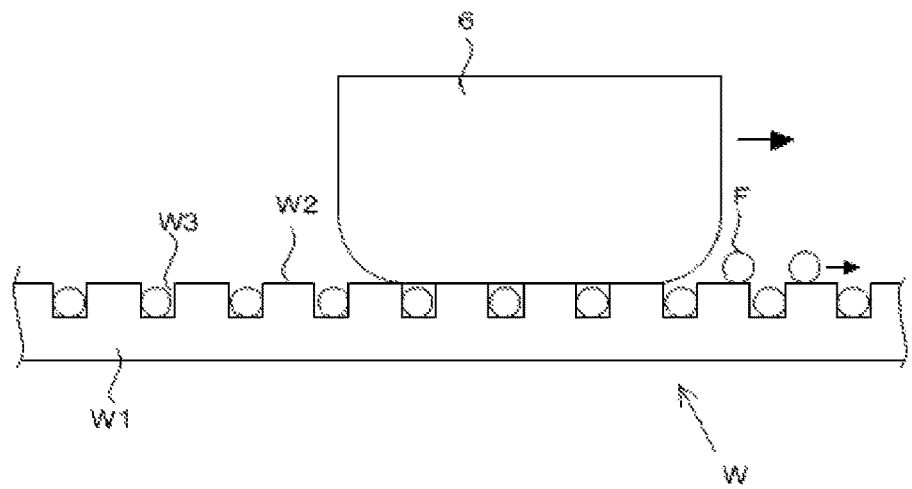
FIG. 6 is an explanatory diagram showing an excessive filler removal operation by the sliding body in the case where the embossed body is used as the object to be slid and the filler is used as the sliding process material.

The planar shape and the depth of the openings of the concaves W3 formed in the embossed main body W1 are determined on the basis of the use of the embossed body and the type and size, etc. of the filler F to fill the concaves W3. For example, as shown in FIGS. 5 and 6, the diameter and depth of a concave W3 can be designed such that a single spherical particle constituting the filler F fits inside. More specifically, to fit a single spherical particle of the filler F into a concave W3, the lower limit of the particle diameter of the sliding process material F can be greater than or equal to visible light wavelengths, preferably 1 μm or more, and more preferably 2 μm or more. The upper limit can be 200 μm or less, for example, and preferably 30 μm or less, more preferably 20 μm, or less, to reduce size variations. In such a case, the opening diameter of the concaves W3 can be preferably greater than or equal to, but not greater than 1.5 times the particle diameter, more preferably greater than or equal to, but not greater than 1.2 times the particle diameter.

To fill a concave W3 with a single spherical particle, the opening shape of the concave W3 and the shape of the spherical particle may be the same or different. The opening shape of the concave W3 and the shape of the spherical particle are preferably analogous or similar. For example, if the concave W3 has a rectangular opening shape with a side ratio of 1:1.2, a spherical particle having a maximum diameter of 1, the same as the short side of the concave W3, is accommodated with appropriate margins. If the material of the embossed main body W1 is a resin or the like and is deformable, the spherical particle can be accommodated by the concave W3 having a conforming shape and the same size.

In contrast, the opening diameter of the concaves W3 may be made greater than the particle diameter of a single particle of the filler F so that a plurality of particles of the filler is accommodated in a concave W3. For example, if minute particles of a filler adhere to the surface of a particle of the filler F in advance, the particle of the filler F and the adhered minute particles of the filler on the surface are accommodated in the concave W3 together. In such a case, the foregoing relationship applies between the size of the particle of the filler F with the minute particles of the filler adhering thereto and the opening diameter.

The arrangement pattern of the concaves W3 in the embossed body W is not limited in particular. For example, the concaves W3 may be regularly arranged with a predetermined repetitive pattern. In a more specific example, the concaves W3 may be arranged in a hexagonal lattice pattern as shown in FIG. 4A. Other lattice patterns such as a square lattice pattern, a rectangular lattice pattern, and a rhombic lattice pattern may also be used. A plurality of lattice patterns of different shapes may be combined. Filler rows in which filler particles are linearly arranged at predetermined distances may be placed side by side at predetermined distances. The repetitive pattern may be continuous, or areas having the repetitive patterns may be repeated at predetermined intervals. Specific repetitive patterns with recognizable markings or minute differences (for example, the opening shapes vary slightly without affecting the filler accommodation) can be preferable in view of product management.

In the present invention, the object to be slid is not limited to one having the foregoing surface unevenness, and may be one having a fine surface, a flat surface, a fragile surface, or a surface with other properties.

<Sliding Process Material>

The sliding process material used in the present invention is selected as appropriate from among powders, particulates, other fillers, solvents other liquids, and other materials. The selection of the sliding process material depends on the use of and other factors pertaining to the object to be slid to which the sliding process material is supplied. The surface of the object to be slid can be cleaned by using a liquid as the sliding process material. If the sliding process material is a filler, the filler may be mixed with a liquid but the mixture obtained is preferably not into a paste form.

The sliding device 1 according to the embodiment shown in FIG. 1 uses the filler F as the sliding process material. If the filler F is used as the sliding process material, the filler may contain one or a plurality of types of powdery materials and/or granular materials. Each individual particle of the powdery and/or granular material(s) may be an independent particle or an aggregate. Smaller particles of a filler may adhere to the surface of the particle of the filler F. The surface may be coated with the smaller particles of the filler. The aggregates may be pulverized by the sliding bodies 6. The aggregates may be simply supplied if the concaves W3 have a size capable of accommodating the aggregates.

The material that forms the filler F can be selected as appropriate according to the use of either the embossed body W or an article manufactured from the embossed body W to which the filler F is supplied. Examples thereof include inorganic fillers (such as metals, metal oxides, and metal nitrides), organic fillers (such as resins and rubbers), and composite fillers made of organic-inorganic composite materials made of organic and inorganic materials. A composite filler may include a mixture of organic and inorganic materials, an organic material surface-coated with an inorganic material, or an inorganic material surface-coated with an organic material. An organic material and an inorganic material may exist in a composite manner. Moreover, two or more types of fillers may be used together as the filler F if needed. The particles of the filler F may have a flat surface or a non-flat surface. For example, minute bumps may be formed.

More specifically, a silica filler, a titanium oxide filler, a styrene filler, an acrylic filler, a melamine filler, various titanates, and the like can be used as the filler F if the embossed body W is an optical film or a delustering film. The filler F may be made of the same material as that of pigment to add a light blocking property or color to the embossed body.

Titanium oxide, magnesium titanate, zinc titanate, bismuth titanate, lanthanum oxide, calcium titanate, strontium titanate, barium titanate, barium titanate zirconate, lead titanate zirconate, and mixtures thereof and the like can be used as the filler F if the embossed body W is a capacitor film.

If the embossed body W is an adhesive film, the filler F may contain a polymeric rubber, silicone rubber, or the like. In such a case, the filler F can function as a spacer, for example.

The filler F may be an electrically insulating material (insulator), or contrarily, a conducting material (conductor), or one exhibiting semiconductor characteristics. Two or more types having different functions or contradictory functions may be used together as the filler F.

In the sliding device of the present embodiment, the filler F is accommodated in predetermined portions (such as the openings of the concaves W3) determined by the surface unevenness of the embossed body W by a dry process. In this respect, the filler F is distinguished from ones containing a mixture of pigment or solder particles and a liquid or paste resin binder, like screen printing paints and solder pastes. The sliding device of the present invention also differs from devices for polishing an object to be slid using powder in that neither the filler nor the object to be slid (embossed body) W is damaged. According to the present invention, at least either one of the filler and the object to be slid can thus be reused. The reused filler can be supplied to the concaves in the embossed body.

The uses of the embossed body W to which the filler F has been supplied are not limited to the foregoing examples, and the sliding device 1 can handle embossed bodies for various uses.

The size of the particles of the filler F can be determined as appropriate on the basis of the use of the embossed body W to which the filler F is supplied. For example, to uniformly fill the concaves W3 in the embossed body W with the filler F, the size is preferably such that a concave W3 of the embossed body W accommodates a single filler particle. However, if needed, the size may be such that a concave W3 accommodates a plurality of filler particles.

The size of the filler particles can be measured using an ordinary particle size distribution measuring instrument. An average particle diameter can also be determined using the particle diameter size distribution measuring instrument. An example of the particle size distribution measuring instrument is a wet flow particle size and shape analyzer FPIA-3000 (Malvern Panalytical). On the other hand, the particle diameter of the filler after the filler was supplied to the concaves W3 of the embossed body W can be determined by plan view or cross-sectional view observation under an optical microscope such as a metallographic microscope, or an electron microscope such as a SEM. In such a case, the number of samples to measure the particle diameter of the filler is desirably 200 or more. If the filler particles have a non-spherical shape, its maximum length or the diameter of its approximate spherical shape can be regarded as the particle diameter of the filler.

From the viewpoint of uniformly accommodating the filler into predetermined portions determined by the surface unevenness of the embossed body W such as the concaves W3, the particle diameter of the filler preferably has small variations. In particular, the CV value (standard deviation/mean) of the variations in the particle diameter of the filler is preferably 20% or less, more preferably 10% or less, and still further preferably 5% or less.

The variations in the particle diameter of the filler can be determined by using the foregoing wet flow particle size and shape analyzer FPIA-3000 (Malvern Panalytical). In such a case, variations of the filler itself can be accurately found out by measuring 1000 or more filler particles, preferably 3000 or more filler particles, and still further preferably 5000 or more filler particles. Variations of the filler disposed on the embossed body can be determined from a planar image or cross-sectional image as with the foregoing measurement of the average particle diameter.

The shape of the filler particles can be selected as appropriate from a spherical shape, an ellipsoidal shape, a cylindrical shape, a needle shape, and combinations thereof according to the use of the embossed body. From the viewpoint of uniformly and precisely accommodating the filler into the concaves W3 of the embossed body W, the filler particles preferably have a spherical shape, particularly preferably the shape of a substantially true sphere.

As employed herein, a substantially true sphere refers to having a sphericity of 70 to 100, given by the following equation:

$$\text{Sphericity} = [1-(So-Si)/So] \times 100.$$

In the foregoing equation, So is the area of the circumscribed circle of the filler particle in a planar image of the filler particle, and Si is the area of the inscribed circle of the filler particle in the planar image of the filler particle.

In this calculation method, filler images are preferably captured in a plan view and a cross-sectional view of the embossed body filled with the filler. In each image, 100 or more filler particles (preferably 200 or more) are arbitrarily measured for the areas of the circumscribed and inscribed circles. The average of the areas of the circumscribed circles and the average of the areas of the inscribed circles are then determined and used as So and Si described above. The sphericity preferably falls within the foregoing range in both the plan view and the cross-sectional view. A difference between the sphericities in the plan view and the cross-sectional view is preferably equal to or less than 20, more preferably equal to or less than 10. The sphericity of the filler particles themselves can be determined using the wet flow particle size and shape analyzer FPIA-3000 (Malvern Panalytical).

<Conveyance Means for Object to be Slid>

The sliding device 1 according to the embodiment shown in FIG. 1 includes a support base 2 configured to support the embossed body W that is the object to be slid, and the conveyance means 3 configured to convey the embossed body W so that the surface W2 of the embossed body W is parallel to the working surfaces 6A of the sliding bodies 6.

As shown in the diagram, the support base 2 has a flat top surface on which the embossed body W is placed. The support base 2 brings the surface of the embossed body W being conveyed into contact with the working surfaces 6A of the sliding bodies 6, or alternatively, the support base 2 supports the surface opposite the working surfaces 6A at a predetermined distance.

As shown in FIG. 1, the conveyance means 3 conveys the plate-shaped embossed body placed on the support base 2 at least from a position where the filler F is supplied to the embossed body W to a position where the processing by the sliding part 4 is completed in a single sheet manner by using a roller conveyor or other apparatus. In such a case, plate-shaped embossed bodies may be intermittently conveyed. On the other hand, if the embossed body is a roll of long film, the embossed body may be conveyed by a roller-to-roller method using a supply roller and a winding roller.

A process material input means 7 configured to input the filler F to a predetermined portion of the embossed body W is preferably capable of adjusting the amount of input per unit time of the filler F to the embossed body W.

<Squeegee>

In the present invention, a squeegee is provided as needed depending on the use of the sliding device, the form of the sliding process material F, the method of inputting the sliding process material F by the process material input means, and other factors. For example, if the filler is input to the central area but not to the entire width of the embossed body W by the process material input means, a squeegee can be provided between the input position and the sliding part 4.

Examples of the material of the squeegee may include rubbers, engineering plastics, metals, and fibers. A non-metal material can have Shore hardness A of 5 to 100. The length of the squeegee in the conveyance direction of the embossed body can be 1 to 50 mm; the roughness Ra at the end surface of the squeegee can be 0.05 to 100; the pressure on the squeegee can be 0.001 to 1 kgf/cm.

In contrast, if the sliding device of the present invention is used to remove or wipe off a nonfunctional sliding process material adhering to the object to be slid, no squeegee is needed.

<Sliding Part>

Figure 3:
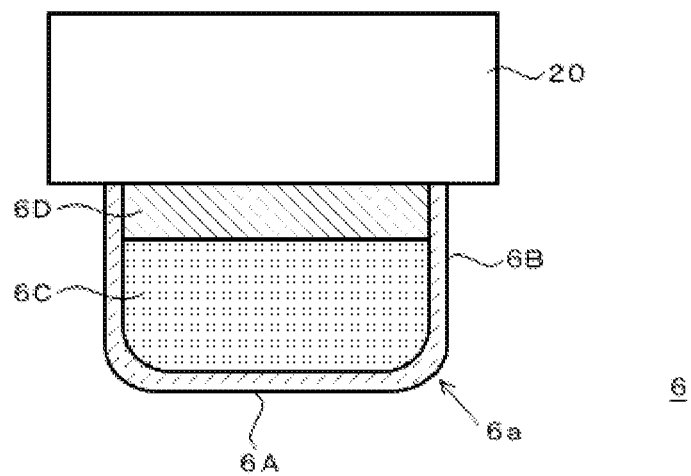
FIG. 3 is a schematic enlarged cross-sectional view of the sliding body.

The sliding part 4 includes the sliding bodies 6 having the flat working surfaces 6A. For example, the sliding bodies 6 may have a cylindrical outer shape as shown in FIG. 3. The sliding body 6 in the diagram is made of a surface member 6B forming the side surface and the working surface 6A that is the bottom surface, an elastic member 6C occupying the inside of the surface member 6B, and a top member 6D. In the present invention, the working surface 6A of the sliding body 6 is not limited to the circular shape and may have a polygonal shape. In view of uniformizing load acting on the filler, the corners 6a between the bottom surface serving as the working surface 6A and the side surface(s) are preferably rounded so that the filler around the sliding body 6 can smoothly enter the working surface 6A.

In the sliding device 1 shown in FIG. 1, the working surface 6A of the sliding body 6 make contact with the surface of the embossed body W. However, in the present invention, the distance between the working surface 6A and the object to be slid can be adjusted as appropriate.

The surface member 6B is formed of a film or fibers of a fluorocarbon resin or the like, in a bottomed cylindrical shape. The circular bottom constitutes the flat working surface 6A. The movability of the sliding process material depends on a combination of the properties of the sliding process material, such as the material and size of the filler, and the properties of the object to be slid, such as the material of the embossed body and the size of the concaves. A preferable range of the coefficient of dynamic friction of the surface member 6B to the surface of the object to be slid is, for example, preferably 25 or less, more preferably 2 or less, and preferably 1 or more. The coefficient of dynamic friction can be measured by a surface property tester TYPE: 14 (HEIDON) manufactured by SHINTO Scientific Co., Ltd., with a load of 100 g and a moving speed of 1000 mm/min. The coefficient of dynamic friction may be measured in compliance with JIS K 7125, at a moving speed of 100 mm/min.

The sliding device 1 shown in FIG. 1 uses a sponge as the elastic member 6C of the sliding body 6 (FIG. 3). Since the elastic member 6C occupies the inside of the sliding body 6, application of useless force to the filler F held between the working surface 6A and the embossed body W and the resulting occurrence of damages such as deformation, cracking, exfoliation, and scratches to the surfaces of the particles of the filler F can be prevented. In the present invention, a spring member for biasing the surface member 6B to the working surface 6A side may be provided as the elastic member 6C.

On the other hand, the top member 6D is connected to the first driving mechanism 20.

The sliding device according to the present invention may include one or a plurality of sliding parts 4. In view of improving the spreadability of the sliding process material over the object to be slid, a plurality of sliding parts is preferably placed side by side in the conveyance direction of the object to be slid. For example, two sliding parts 4 can be placed side by side in the conveyance direction of the embossed body W. In such a case, the distance between the adjoining sliding parts 4 can be adjusted as appropriate on the basis of the area to spread the sliding process material over the object to be slid, processing speed, and the like.

Each sliding part 4 includes a plurality of sliding bodies 6. For example, three to six sliding bodies 6 can be arranged on a sliding part 4 in a triangular lattice pattern, a rectangular lattice pattern, a radial pattern, or the like. In such a case, the distances between the adjoining sliding bodies 6 can be adjusted depending on the material of the filler. Greater distances are preferable in terms of discontinuity of the load acting on the filler. Smaller distances can improve the spreadability since the filler is continuously spread out. If more importance is attached to the improvement of the spreadability, the distances between the adjoining sliding bodies 6 are preferably smaller. For example, the closest distance can be preferably 2 to 500 mm, more preferably 2 to 300 mm, and still further preferably 10 to 50 mm.

In the present invention, the aspect of movement of the sliding bodies 6 by the first driving mechanism 20 and the aspect of movement of the sliding part 4 by the second driving mechanism 30 are such that their respective moving directions are regularly changed, preferably smoothly and regularly in particular. Examples may include orbital motions on various smoothly closed curves such as a circle, an ellipse, a lemniscate, a cycloid, and a rose curve, and circular motions. Such aspects of movement can be configured by using a cam mechanism, a gear mechanism, a rotary mechanism, and the like. If the sliding bodies 6 and the sliding part 4 take any of the aspects of movement, as shown in FIG. 2, an arbitrary point P in the working surface 6A of a sliding body is moved by the first driving mechanism 20 to move along the broken-lined locus in the working surface 6A at a speed of Vx, and moved by the second driving mechanism 30 to move along the double-dotted dashed-lined locus within a plane including the working surface 6A at a speed of Vy. This makes the amount of movement per unit time of this point P over the surface of the object W to be slid greater than in a case where the point P is moved by either one of the first and second driving mechanisms 20 and 30. The sliding process material F can thus be sufficiently spread over the object W to be slid. In particular, if the point P makes linear reciprocations, the sliding process material fails to be sufficiently spread out at portions where the moving direction turns abruptly, and the filler F can be flipped out of the region to be slid and wasted or cause contamination of the surroundings. Smoothly changing the moving direction of the point P in a rounded manner can further improve the spreadability and prevent the filler F from being flipped out of the region to be slid. Moreover, the amount of movement of the foregoing point P with respect to the object W to be slid is further increased by the conveyance means 3. This further improves the spreadability of the sliding process material F over the object W to be slid. By contrast, if the amount of movement of the point P is too small, the sliding process material F is unable to be sufficiently spread over the object W to be slid. If the moving speed caused by the conveyance means 3 is too high, the spreadability also drops since the sliding process time is not sufficient. The speed at which the conveyance means 3 moves the object W to be slid is therefore preferably determined as appropriate according to the moving speeds of the sliding bodies 6 and the sliding part 4.

As described above, the amount of movement per unit time of an arbitrary point P in the working surface 6A is increased by the action of the first driving mechanism 20 and the second driving mechanism 30. This means that the amount of relative movement of the point in the working surface 6A with respect to a reference point in the object W to be slid increases. According to the present invention, the sliding process material F is uniformly supplied to the object W to be slid. In cases where the object W to be slid being an embossed body, the ratio of the sliding process material F filling the concaves increases and an excess of the sliding process material F can be removed from the object W to be slid.

<Uses of Sliding Device>

The sliding device according to the present invention can be used as a device configured to supply a filler to concaves in a concaved object W to be slid such as an embossed body by a dry process, a device configured to remove an excess of a filler from an embossed body to which the filler has been supplied, a device configured to supply a liquid material or the like, such as a solvent, to a flat surface of a given object W to be slid and wiping off the liquid material or the like, a device configured to clean the surface of an object W to be slid, etc.

<Method for Using Sliding Device>

A method for using the sliding device according to the present invention includes selecting an object W to be slid and a sliding process material F as appropriate on the basis of the intended use, and setting the object W to be slid and the sliding process material F into the sliding device. In addition, the driving speeds of the first driving mechanism 20 and the second driving mechanism 30 are adjusted. If the object W to be slid is conveyed by the conveyance means 3 during the sliding process using this sliding device 1, the conveyance speed is also adjusted.

Suppose, for example, that an embossed body W is selected as the object to be slid, a filler F is selected as the sliding process material, and the filler F is uniformly filled into the concaves W3 of the embossed body which are regularly arranged in the surface of the embossed body W. In such a case, the embossed body W is initially placed on the support base 2, the support base 2 is set on the conveyance means 3, and the conveyance means 3 and the first driving mechanism 20 and the second driving mechanism 30 of the sliding part 4 are driven at respective predetermined speeds. If the embossed body W is a film, a winding mechanism or the like is preferably used as described above.

Next, the filler F is supplied to a specific portion of the embossed body W at a predetermined input rate. The amount of supply can be determined on the basis of the purpose of the sliding process, such as what percentage of the number of concaves W3 in the embossed body W is to be filled with the filler F. Typically, the number of inputted filler particles with respect to the number of concaves in the embossed body is preferably 250% or less, more preferably 200% or less, and still further preferably 150% or less. The lower limit of the amount of supply may be below 100%. The reason is that the number of filler particles can be smaller than the number of concaves W3 depending on the purpose of the sliding process. The number of concaves in the embossed body can be determined in a similar manner to that for the number of concaves in determining a residual ratio to be described below.

If a squeegee is provided downstream of the input portion as needed, the filler F passes under the squeegee and is thereby spread over the embossed body W to some extent.

The filler F on the embossed body W then reaches the first sliding part 4 (upstream sliding part). The sliding bodies 6 are moved by the first driving mechanism 20 and the second driving mechanism 30. As shown in FIG. 5, the filler F in contact with the side surface of a sliding body 6 enters between the working surface 6A of the sliding body 6 and the embossed body W, and the filler F captured by the working surface 6A moves in the moving direction of the sliding body 6 and enters concaves W3 in the embossed body W. If particles of the filler F fail to be brought into concaves W3 by the sliding body 6, which was first in contact with the particles of the filler F, a sliding body 6 adjoining the sliding body 6 makes contact with the particles of the filler F and the particles of the filler F are guided to the concaves W3 again.

According to the present invention, the use of the first driving mechanism and the second driving mechanism can increase the amount of movement per unit time of a given point P in the working surface 6A of a sliding body 6. In particular, since a plurality of sliding bodies 6 is provided on a sliding part 4 and a plurality of sliding parts 4 is placed side by side on the sliding device, the filler F on the embossed body W is uniformly supplied onto the embossed body W by the sliding process using the sliding bodies 6, and the efficiency of filling of the concaves W3 in the embossed body improves. Consequently, according to the present invention, the ratio (filling ratio) of the number of particles of the filler F filling the concaves W3 relative to the number of concaves W3 in the embossed body W can be preferably 90% or more, more preferably 95% or more, still further preferably 97% or more, and particularly preferably 99.5% or more. As will be described below, the filling ratio can be determined by a similar technique to that for determining the residual ratio. As described above, the present invention is not necessarily limited to bringing the filling ratio close to 100%.

In conventional printing apparatuses and the like, a filler F accumulates upstream of the squeegee. By contrast, in the sliding device 1 according to the present invention, the use of the sliding bodies 6 makes the filler less likely to accumulate around the sliding bodies 6 and can prevent filler particles from rubbing against and damaging each other in the filler accumulation.

In the sliding process using the sliding body 6, as shown in FIG. 6, the filler F is moved over the embossed body W by the sliding bodies 6. Here, the filler F is not pushed into concaves W3 in front but removed from the surface of the embossed body W if the concaves W3 are already filled with the filler F. In such a case, the sliding device 1 functions as a device configured to remove a surplus filler. In the present invention, another device configured to remove a nonfunctional filler as a separate process may be added.

In this respect, according to the device of the present invention, the ratio (residual ratio) of the number of filler particles remaining on the embossed body W without filling the concaves W3 per unit area of the region to be slid of the embossed body W relative to the number of concaves W3 per unit area can be preferably 2% or less, more preferably 1% or less, and still further preferably 0.5% or less.

The residual ratio is preferably determined by sampling five or more, preferably 20 or more, rectangular regions of 200 μm or more on each side from the region to be slid of the embossed body W for a total area of 1 mm$^2$ or more, preferably 4 mm$^2$ or more, and measuring the number of concaves W3 of the embossed body W in this area and the number of filler particles remaining on the embossed body W without filling the concaves W3. If the entire area of the embossed body W is extremely large, it is preferably that ten or more regions having an area of 1% of the entire area are arbitrarily sampled and the foregoing residual ratio is measured in the sampled regions. The foregoing filling ratio can be determined by a similar technique, by measuring the number of concaves W3 and the number of concaves filled with the filler. Note that the number of concaves W3 may be measured in advance to determine the number density of concaves W3 per unit area.

The number of concaves W3 per unit area, the number of concaves W3 filled with the filler, and the number of filler particles remaining on the embossed body without filling the concaves W3 can be measured by using an optical microscope such as a metallographic microscope, an electron microscope such as an SEM, or other conventional observation means. Conventional image analysis software (such as WinROOF (MITANI Corporation) and A-Zou Kun (registered trademark) (Asahi Kasei Engineering Corporation)) may be used for a simplified determination.

A difference between the ratio (supply ratio) of the number of particles of the filler F supplied per unit area of the region to be slid of the embossed body W relative to the number of concaves W3 per unit area and the ratio (filling ratio) of the number of filler particles filling the concaves W3 per unit area relative to the number of concaves W3 per unit area will be referred to as a surplus ratio (surplus ratio=supply ratio−filling ratio). The surplus ratio can be preferably 160% or less, more preferably 105% or less, and still further preferably 50% or less.

The moving speed of the sliding bodies 6 by the first driving mechanism 20, the moving speed of the sliding part 4 by the second driving mechanism 30, and the conveyance speed of the embossed body W by the conveyance means 3 are selected as appropriate on the basis of the size, shape, and distribution density of the concaves in the embossed body, the maximum particle diameter and properties of the filler F, etc.

<Postprocessing for Sliding Process>

After the supply of the filler to the concaves in the surface of the embossed body, a resin layer may be provided on the surface of the embossed body for purposes such as protecting the disposition state of the filler by applying a curable liquid material to the surface of the embossed body to which the filler has been supplied, and curing the curable liquid material. A resin layer may be provided by directly bonding a resin film to the surface of the embossed body to which the filler has been supplied. Moreover, the resin layer or resin film provided on the surface of the embossed body to which the filler has been supplied can be peeled off to transfer the filler to a resin layer, a resin film, or the like different from the embossed body. Curable liquid materials and resin films used in conventional adhesives and pressure-sensitive adhesives can be used as the curable liquid material and the resin film. Minute particles of a filler different from and smaller than those of the filler may be included in the curable liquid material or the resin film in advance.

The layer provided on the surface of the embossed body after the supply of the filler or another destination material to which the filler having been supplied to the surface of the embossed body is transferred may include materials other than resin. The materials other than resin can be selected as appropriate from various materials as with the materials of respective layers in the case where the embossed body has a layered structure.

After the supply of the filler to the embossed body, a sliding process that includes spraying a solvent to the object to be slid may be performed to remove an excess of the filler present other than in the concaves of the embossed body. According to the present invention, such a sliding process can be performed so that the disposition state of the filler is maintained.

The foregoing process after the supply of the filler to the embossed body can be performed regardless of the method for forming the surface unevenness of the embossed body W or the surface material. The process can therefore also be applied if the surface unevenness of the embossed body is formed by stacking either layers having surface unevenness or layers having holes. The process can also be applied if the layers having surface unevenness or the layers having holes are made of various materials, like the materials of respective layers in the case where the embossed body has a layered structure. For example, if the surface of the embossed body W is formed of a metal layer having holes, the foregoing process can be performed to protect the disposition state of the filler in the holes or transfer the filler in the holes to another material.

The present invention can include various peripheral devices as long as the sliding device according to the present invention is included. For example, if the object W to be slid is a plate-shaped embossed body, a conveyor type conveyance mechanism configured to continuously feed plate-shaped embossed bodies to the sliding device, a fixing mechanism, and a collection device configured to collect the plate-shaped embossed bodies after the sliding process to a predetermined place can be included. If the object W to be slid is a film-shaped embossed body, a mechanism configured to feed a roll of film-shaped embossed body to the sliding device and a winding device configured to wind up the film-shaped embossed body after the sliding process can be included.

A mechanism and the like configured to provide the foregoing resin layer or resin film for purposes such as protecting the disposition state of the filler on the filler-supplied surface of the embossed body may also be provided. A sliding device including a built-in inspection mechanism (camera or sensing device) configured to check the filling state or remaining state of the filler or the state of presence of the spread filler is also covered by the present invention.

EMBODIMENT

An embodiment of the present invention will be described more concretely below.

Embodiment 1

(1) Device Configuration

A sliding device 1 including two sliding parts 4 placed side by side in the conveyance direction (arrow Z) of a thin film-shaped embossed body W was fabricated. In such a case, the working surface 6A and the surface member 6B of each sliding body 6 were formed of a bottomed cylindrical molded article (20 mm in thickness) of polytetrafluoroethylene, and a sponge was put inside as the elastic member 6C. The sliding body 6 had a cylindrical outer shape, and the working surface 6A had a diameter of 80 mm. Each sliding part 4 included five sliding bodies 6 with a closest distance of 14 mm between the sliding bodies 6, which were radially arranged around the rotation axis of the sliding part 4. Each sliding body 6 was rotated about its rotation axis by the first moving mechanism 20, and the sliding part 4 was rotated about the rotation axis of the sliding part 4 by the second moving mechanism 30. The distance between the center axis of each sliding body 6 and the center axis of the sliding part 4 was 80 mm. The width of the region to be slid was the same as the width of one sliding part 4. The distance between the center axes of the two sliding parts 4 placed side by side in the conveyance direction of the object W to be slid was 300 mm.

An embossed body was formed by arranging cylindrical concaves having an opening diameter of 6 μm and a depth of 7 μm in a hexagonal lattice pattern with a center-to-center distance of 10 μm over a 30-μm-thick film formed by photocuring a photocurable resin composition containing 100 parts by mass of an acrylate resin (M208, Toagosei Co., Ltd.) and 2 parts by mass of a photopolymerization initiator (IRGACURE 184, BASF), laminated on a PET film (50 μm in thickness). A roll (100 m or more in length) of the embossed body was used as the object W to be slid. The object W to be slid had a width (i.e., film width) sufficiently greater than the width of the region to be slid, and was located so that the center of the region to be slid in the film width direction came to the center of the film width.

The sliding process material F was a filler made of crosslinked polymethyl methacrylate, having a particle diameter of 5 μm (classified from EPOSTAR MA1006 manufactured by Nippon Shokubai Co., Ltd).

(2) Contact Length of Sliding Body, and Filling Ratio and Surplus Ratio

To find out a best-mode sliding process condition for reducing the surplus ratio of the foregoing sliding device, sliding tests were conducted by changing the rotation speed of the sliding bodies 6 by the first driving mechanism 20 in the range of 20 to 100 rpm and the rotation speed of the sliding parts 4 by the second driving mechanism 30 in the range of 20 to 100 rpm, with the line speed of the conveyance means 3 at 1, 2, or 3 m/min.

In each sliding test, the contact length of the sliding bodies 6 was calculated by simulation. As employed herein, the "contact length of a sliding body" refers to a total length of the locus of a predetermined reference point in the object W to be slid on the working surface 6A of the sliding body 6 passing over the reference point during a sliding process. If the working surfaces 6A of a plurality of sliding bodies 6 pass over the reference point, the contact length refers to a total of the lengths of the loci of the reference point on the respective working surfaces. In the present embodiment, a point on the widthwise centerline of the embossed body is assumed as the reference point. The contact length refers to the total length of the loci of the reference point on the working surfaces 6A passing over the reference point during the sliding process between arrival of the reference point at the upstream sliding part 4 and departure of the reference point from the downstream sliding part 4.

Figure 7:
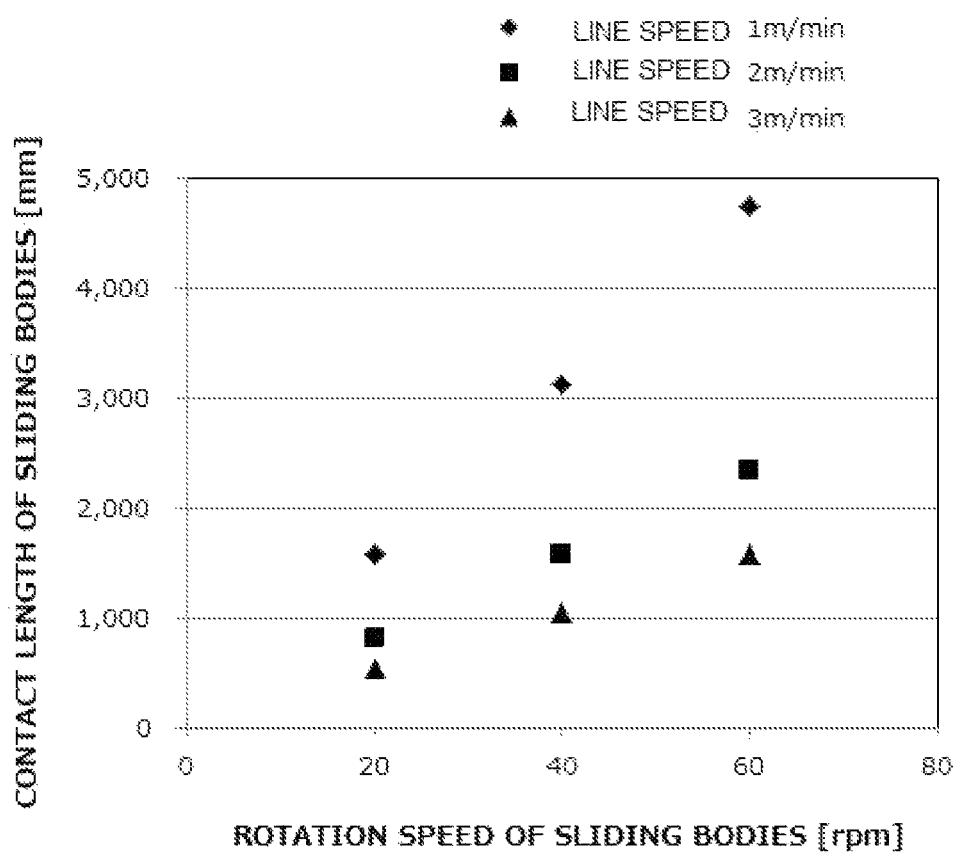
FIG. 7 is a chart showing a relationship between a rotation speed of the sliding body and a contact length of the sliding body.

FIG. 7 shows a relationship between the rotation speed (rpm) of the sliding bodies 6 and the contact length of the sliding bodies 6.

Meanwhile, the filling ratio of the filler in each sliding test was measured, where the filler F was inputted so that the number of particles of the filler F supplied per unit area of the region to be slid of the embossed body W was 1.4 times or more and not more than 1.5 times the number of concaves W3 per unit area.

As employed herein, the filling ratio refers to the ratio ($100 \times N1/N0$, %) of the number N1 of filler particles filling the concaves in the embossed body relative to the number N0 of concaves in the embossed body per unit area of the region to be slid of the embossed body W.

The filling ratio was calculated by arbitrarily sampling ten 1-mm-by-1-mm regions in the central area of the region to be slid (60% of the region to be slid at the center in the width direction) of the embossed body W after the embossed body W was slid-processed for 100 m or more in the conveyance direction, and measuring the number of particles filling the concaves W3 in each region. The residual ratio was also calculated by measuring the numbers of particles remaining on the embossed body W without filling the concaves W3 in the same regions.

Figure 8A:
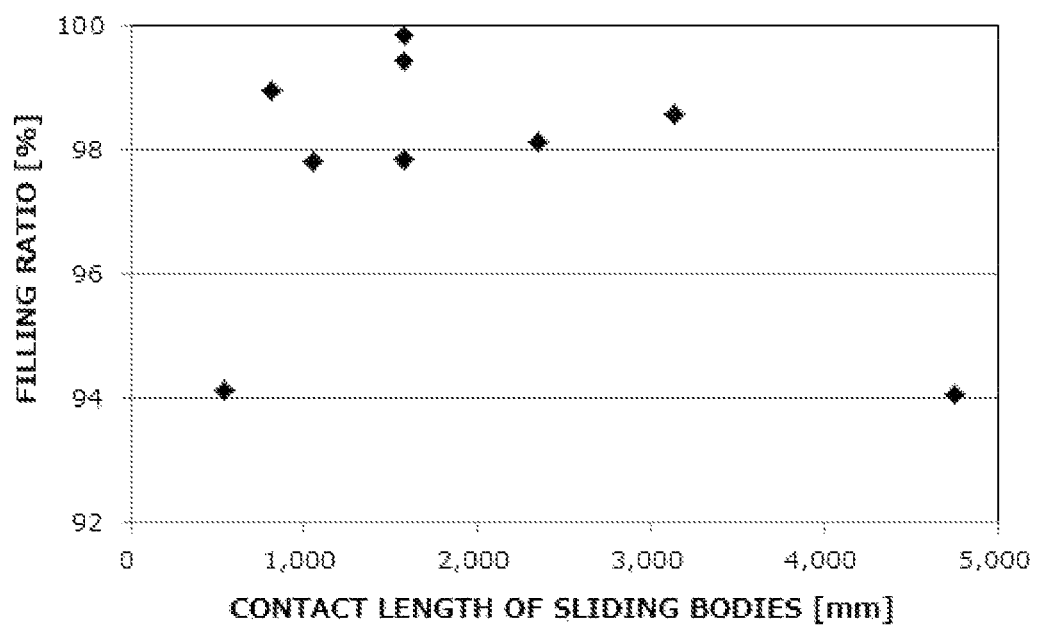
FIG. 8A is a chart showing a relationship between the contact length of the sliding body and a filling ratio of the filler.

FIG. 8A shows a relationship between the contact length of the sliding bodies and the filling ratio of the filler.

From FIG. 8A, it can be seen that, in this test system, the filling ratio improves to 97% or above if the contact length of the sliding bodies is in the range of 1000 to 3200 mm.

The residual ratio was 2% or less in any of the measured regions.

The filler-filled embossed bodies having a filling ratio of 97% or more in FIG. 8A were each measured for the filling ratio and the residual ratio at the starting point of the sliding process on the embossed body, a point 1.5 m downstream from the starting point, a point 10 m downstream from the starting point, and subsequent downstream points at intervals of 10 m up to 100 m from the starting point (a total of 12 points). The filling ratio was confirmed to be 97% or more, and the residual ratio 2% or less, at any of the points.

Figure 8B:
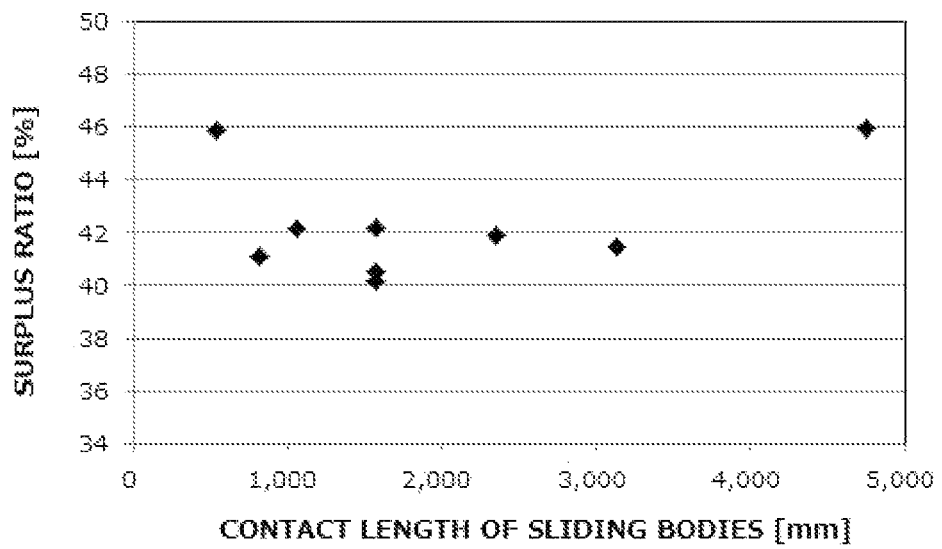
FIG. 8B is a chart showing a relationship between the contact length of the sliding body and a surplus ratio of the filler.

Moreover, the surplus ratio of the filler in each sliding test was measured, where the filler F was inputted so that the number of particles of the filler F supplied per unit area of the region to be slid of the embossed body W was 1.4 times or more and not more than 1.5 times the number of concaves W3 in the embossed body W per unit area. As employed herein, the surplus ratio is a numerical value calculated by the surplus ratio=the supply ratio−the filling ratio. Here, the supply ratio Ns (%) is the ratio of the number of particles of the filler F supplied per unit area of the region to be slid of the embossed body W relative to the number of concaves W3 per unit area. The filling ratio (%) is the ratio of the number N1 of filler particles filling the concaves W3 per unit area relative to the number N0 of concaves W3 per unit area ($100 \times N1/N0$). FIG. 8B shows a relationship between the contact length of the sliding bodies and the surplus ratio of the filler.

From FIG. 8B, it can be seen that, in this test system, the surplus ratio falls to or below 42% and the amount of the filler F to be supplied can be reduced at contact lengths of the sliding bodies of 1000 mm or more.

Figure 9:
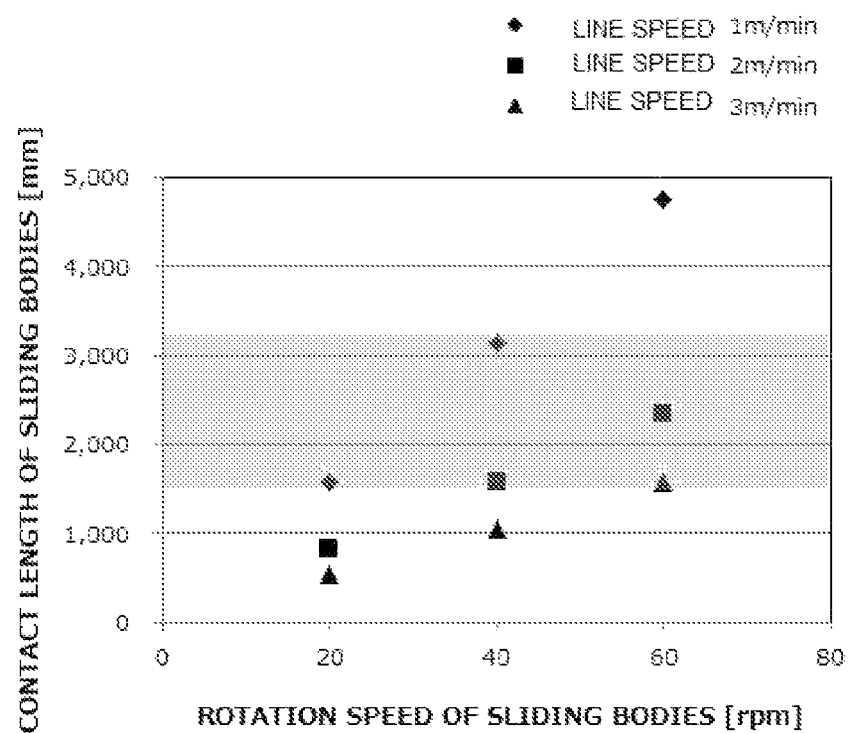
FIG. 9 is a chart showing a relationship between the rotation speed of the sliding body and the contact length of the sliding body.

FIG. 9 shows a relationship between the rotation speed of the sliding bodies by the first driving mechanism 20 and the contact length of the sliding bodies in the foregoing sliding tests, with respect to each line speed. From FIGS. 8A and 8B, it can be seen that the contact length of the sliding bodies is preferably set to approximately 1500 mm to 3200 mm (range filled with gray) under the relationship of the sliding process material and the object to be slid in the tests. It can thus be seen that to bring the filling ratio close to 100% and reduce the surplus ratio, the line speed is preferably set within a predetermined range with respect to the rotation speed of the sliding bodies. Note that the respective preferable ranges of the rotation speed of the sliding bodies, the contact length of the sliding bodies, and the line speed depend on the combination of the object to be slid and the sliding process material and the purpose of the sliding process, and the present invention is not limited to the ranges of the present embodiment.

For the sake of reference, the two sliding parts 4 in the device configuration of Embodiment 1 were replaced with a squeegee (forming material: urethane, 120 mm in length (length in the direction orthogonal to the conveyance direction of the object W to be slid), 10 mm in thickness) installed so that the bottom edge of the squeegee made contact with the object W to be slid (installation angle of 70°). The filling ratio and the surplus ratio of the filler were measured as in Embodiment 1 at a line speed of 2 m/min and a pressure of 0.1 MPa. Here, the amount of filler supply was gradually increased and the filling ratio and the surplus ratio at each amount of supply were measured to determine the amount of supply to achieve a filling ratio of 97% or more. The amount of supply was approximately four times that in the mode of Embodiment 1 with the same line speed (2 m/min). The surplus ratio was approximately 12 times.

REFERENCE SIGNS LIST

F sliding process material, filler
W object to be slid, embossed body
W1 embossed main body
W2 surface
W3 concave
1 sliding device
2 support base
3 conveyance means
4 sliding part
6 sliding body
6a corner
6A working surface
6B surface member
6C elastic member
6D top member
20 first driving mechanism
30 second driving mechanism

The invention claimed is:

1. A sliding system for performing a sliding process on a surface of an object to be conveyed, the sliding system comprising:
a sliding device and the object; the surface of the object having concaves; the sliding device further comprising:
a sliding part including a plurality of sliding bodies each having a working surface which is planar; and
a drive configured to move the sliding part and the sliding bodies with respect to the object, the drive configured to move the sliding part in parallel with the working surface of each sliding body and in a direction different from a moving direction of the sliding bodies while moving the sliding bodies in parallel with the working surface of each sliding body,
wherein the sliding device is configured to perform a sliding process on a surface of the object by sliding the sliding bodies of the sliding part across the surface of the object, and
the drive includes a plurality of first drivers configured to move corresponding sliding bodies independently in parallel with the working surface of each sliding body,
the sliding device further comprises a filler supply device for supplying a filler in a dry process,
the object is conveyed continuously,
the sliding device is configured to capture the filler by the working surface of at least one sliding body and move the filler in the moving direction of the at least one sliding body such that the filler enters into the concaves of the object,
each sliding body includes a surface member forming the working surface and an elastic member disposed inside the surface member, and
the drive further includes: a second driver configured to move the sliding part in parallel with the working surface of each sliding body in a direction different from a direction in which the first drivers move the sliding bodies.

2. The sliding system according to claim 1, comprising a means for conveying the object in parallel with the working surface of each sliding body.

3. The sliding system according to claim 2, wherein the sliding part includes a plurality of sliding parts placed side by side in a conveyance direction of the object.

4. The sliding system according to claim 1, wherein the working surface of each sliding body has a coefficient of dynamic friction relative to the surface of the object of 25 or less.

5. The sliding system according to claim 1, wherein a contact length of each sliding body is 1500 mm to 3200 mm.

6. The sliding system according to claim 1, wherein the object is a film.

7. The sliding system according to claim 1, wherein the filler comprises particulates.

8. The sliding system according to claim 1, wherein the object is an embossed body and the filler is uniformly supplied to concaves of a surface of the embossed body by use of the sliding body included in the sliding part.

9. The sliding system according to claim 1, wherein the object is an embossed body and the filler comprises particulates, and the sliding process is performed so that the particulates are uniformly supplied to concaves of a surface of the embossed body by use of the sliding body included in the sliding part.

10. The sliding system according to claim 1, wherein the drive is configured to (i) rotate the sliding part about a rotation axis of the sliding part, and (ii) rotate each of the sliding bodies about a rotation axis of the respective sliding body.

11. The sliding system according to claim 1, wherein the drive is configured to simultaneously (i) rotate the sliding part about a rotation axis of the sliding part, and (ii) rotate each of the sliding bodies about a rotation axis of the respective sliding body.

12. The sliding system according to claim 1, wherein the drive further includes a second driver,
each of the plurality of first drivers are configured to rotate respective sliding bodies about a rotation axis of the respective sliding body, and
the second driver is configured to rotate the sliding part about a rotation axis of the sliding part.

* * * * *